US011588055B2

(12) United States Patent
Liu et al.

(10) Patent No.: US 11,588,055 B2
(45) Date of Patent: Feb. 21, 2023

(54) THIN-FILM TRANSISTOR AND METHOD FOR MANUFACTURING THE SAME, ARRAY SUBSTRATES, DISPLAY DEVICES

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Wei Liu, Beijing (CN); Yongbo Ju, Beijing (CN); Xikang Jin, Beijing (CN); Zhimin Wang, Beijing (CN); Jianbin Gao, Beijing (CN); Xiaoguang Chen, Beijing (CN); Xinbo Zhou, Beijing (CN); Jianjun Chen, Beijing (CN)

(73) Assignees: ORDOS YUANGSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 634 days.

(21) Appl. No.: 16/335,065

(22) PCT Filed: Sep. 25, 2018

(86) PCT No.: PCT/CN2018/107269
§ 371 (c)(1),
(2) Date: Mar. 20, 2019

(87) PCT Pub. No.: WO2019/095857
PCT Pub. Date: May 23, 2019

(65) Prior Publication Data
US 2021/0328073 A1    Oct. 21, 2021

(30) Foreign Application Priority Data
Nov. 16, 2017 (CN) .......................... 201711137106.6

(51) Int. Cl.
H01L 29/786    (2006.01)
H01L 29/66    (2006.01)

(52) U.S. Cl.
CPC .... H01L 29/78672 (2013.01); H01L 29/6675 (2013.01); H01L 29/78618 (2013.01)

(58) Field of Classification Search
CPC ......... H01L 29/78672; H01L 29/78675; H01L 29/6675; H01L 29/66757
See application file for complete search history.

(56) References Cited

U.S. PATENT DOCUMENTS 9,882,057 B2    1/2018    Tian
2011/0223697 A1    9/2011    Yong-Hwan et al.
(Continued)

FOREIGN PATENT DOCUMENTS

CN    103456745 A    12/2013
CN    103985637 A    8/2014
(Continued)

OTHER PUBLICATIONS

International Search Report; Application No. PCT/CN2018/107269; dated Dec. 29, 2018; English Translation Attached.
(Continued)

Primary Examiner — Syed I Gheyas
(74) Attorney, Agent, or Firm — Nath, Goldberg & Meyer; Joshua B. Goldberg

(57) ABSTRACT

The present disclosure provides a thin-film transistor and a method for manufacturing the same, an array substrate, and a display device. The thin film transistor of the present disclosure include a plurality of insulating layers, among which at least one insulating layer on the low temperature polysilicon layer comprises organic material, so vias could be formed in the organic material by an exposing and developing process, thereby effectively avoiding the over-
(Continued)

etching problem of the low temperature polycrystalline silicon layer caused by dry etching process. By adopting the method for manufacturing the film transistors of the present disclosure, the contact area and uniformity of the drain electrode and the low temperature polysilicon material layer can be increased; the conductivity can be improved; and the production cycle of products can be greatly reduced and thereby improving the equipment capacity.

1 Claim, 3 Drawing Sheets

(56) References Cited

U.S. PATENT DOCUMENTS

| | | | | |
|---|---|---|---|---|
| 2012/0287349 | A1* | 11/2012 | Tsubata | G09G 3/3637 |
| | | | | 348/731 |
| 2013/0140531 | A1* | 6/2013 | Park | H01L 51/0097 |
| | | | | 257/40 |
| 2015/0049409 | A1 | 2/2015 | Choi et al. | |
| 2015/0227013 | A1* | 8/2015 | Hao | G02F 1/136209 |
| | | | | 349/46 |
| 2015/0279870 | A1 | 10/2015 | Jiang | |
| 2016/0315101 | A1 | 10/2016 | Afzali-Ardakani et al. | |
| 2018/0017867 | A1* | 1/2018 | Kamemoto | G03F 7/0233 |

FOREIGN PATENT DOCUMENTS

| | | |
|---|---|---|
| CN | 107272964 A | 10/2017 |
| CN | 207367976 U | 5/2018 |
| EP | 2996147 A1 | 3/2016 |
| GB | 2311653 A | 10/1997 |
| WO | 2016158406 A1 | 10/2016 |

OTHER PUBLICATIONS

Extended European Search Report dated Jul. 9, 2021 corresponding to application No. 18855143.6-1230.

* cited by examiner

_(1)_

THIN-FILM TRANSISTOR AND METHOD FOR MANUFACTURING THE SAME, ARRAY SUBSTRATES, DISPLAY DEVICES

This is a National Phase Application filed under 35 U.S.C. 371 as a national stage of PCT/CN2018/107269, filed Sep. 25, 2018, an application claiming the benefit of Chinese Application No. 201711137106.6, filed Nov. 16, 2017, the content of each of which is hereby incorporated by reference in its entirety.

TECHNICAL FIELD

The present disclosure belongs to the field of display technology, particularly relates to a thin-film transistor and a method for manufacturing the same, an array substrate, and a display device.

BACKGROUND ART

Technology of low temperature poly silicon (LTPS) is used to form polysilicon (p-Si) from amorphous Silicon (a-Si) films by "low temperature" crystallization process. In the transformation process from a-Si to p-Si, only a-Si in a thickness of about 50 angstrom from a surface is transformed into p-Si and thus the thickness of the formed p-Si is very thin, so that the over-etching phenomena (i.e. p-Si being etched away or too thin) frequently appears in the subsequent dry etching process, thereby resulting in a smaller contact area or uneven contact between SD and p-Si.

SUMMARY

To solve the problem that p-Si is easy to be over-etched in existing LTPS, the present disclosure provides a thin-film transistor and a method for manufacturing the same, an array substrate, and a display device.

The present disclosure provides a thin-film transistor comprising a substrate, and a low temperature polysilicon layer, a plurality of insulating layers and a gate on the substrate;

Wherein at least one insulating layer which is located on the side of the low temperature polysilicon layer away from the substrate, comprises organic material and has one or more via(s).

Optionally, the plurality of insulating layers include a first insulating layer having first vias, wherein the first insulating layer is arranged between the low temperature polysilicon layers and the gate and the gate is arranged on the side of the first insulating layers away from the substrate.

Optionally, the plurality of insulating layers further include a second insulating layer having second vias, wherein the second insulating layer is located on the side of the gate away from the substrate.

Optionally, the thin-film transistors further include:

A source electrode and a drain electrode which are located on the side of the second insulating layer away from the substrate, and the source electrode and the drain electrode are contacted with the low-temperature polysilicon layer through the first and second vias.

Optionally, the orthographic projection of the first vias on the substrates at least partially coincides with the orthographic projection of the second vias on the substrates.

Optionally, the thin-film transistors further include: a planarization layer, a public electrode and a pixel electrode, the flat layers are located on the side of the sources and drains away from the substrates, wherein the public electrode is located on the side of the planarization layer away from the source electrode and drain electrode, and the planarization layer and the public electrode both have third vias at the location corresponding to the drain electrode through which the pixel electrode is contacted with the drain electrode through the third vias.

Optionally, the organic materials are resin materials, such as anyone or any combination of polymethyl methacrylate (PMMA), polyethylene terephthalate (PET), polycarbonate (PC), polyurethane (PU) or polyimide (PI).

Optionally, one insulating layer has a thickness of 1.5 μm to 3.0 μmin the direction perpendicular to the substrates.

Optionally, a buffer layer is provided between the substrate and the low temperature polysilicon layer.

The present disclosure provides an array substrate including a plurality of the above-mentioned thin-film transistors arranged in an array.

The present disclosure also provides a display device including the array substrate.

The present disclosure also provides a method for manufacturing a thin-film transistor, including the following steps:

Forming a low temperature polysilicon layer on a substrate;

forming an organic insulating layer on the side of the low-temperature polysilicon layer away from the substrate and forming vias in the organic insulating layer;

forming a first metal layer and patterning the first metal layer to obtain agate of the thin-film transistor.

Optionally, forming an organic insulating layer with vias comprises the following steps:

Coating organic material on the low temperature polysilicon layer to obtain a film;

performing a first curing of the obtained film;

exposing and developing the film after the first curing to form the vias;

performing a second curing of the film with the vias to form the organic insulating layer.

Optionally, the first curing is carried out at vacuum degree of 20 pa to 100 pa and temperature of 80° C. to 130° C. for 90 s to 140 s; and the second curing is carried out at atmospheric pressure and temperature of 200° C. to 250° C. for 40 min to 120 min.

REFERENCE NUMBERS

1. Substrates; 2. Low-temperature polysilicon layers; 21. Doping region; 3. Insulating layers; 31. A first insulating layer; 32. A second insulating layer; 4. Gate; 5. Vias; 51. first vias; 52. Second vias; 53. Third vias; 61. Source electrode; 62. Drain electrode; 7. planarization layer; 81. Public electrode; 82. Pixel electrode; 91. Buffer layer; 92. Passivation layer.

SPECIFIC IMPLEMENTATION METHODS

The present invention will be further described in detail with reference to the accompanying drawings and specific embodiments in order to provide a better understanding of the technical solutions of the present invention by those skilled in the art.

Figure 1:
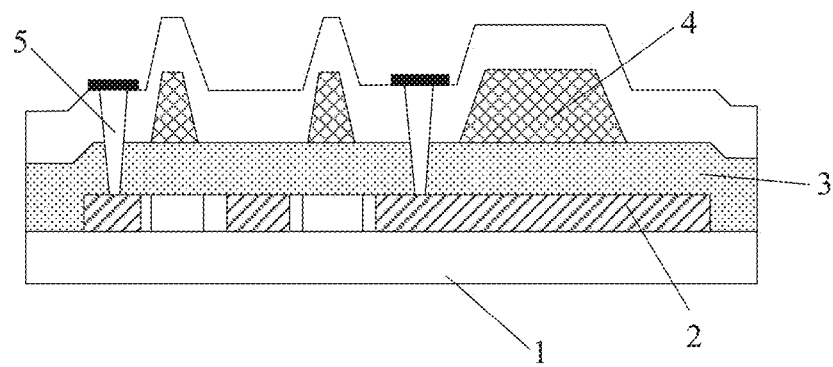
FIG. 1 is a schematic diagram of the thin-film transistor structure according to an embodiment of the present disclosure.

Some embodiments of the present disclosure provide a thin-film transistor, as shown in FIG. 1, comprising a substrate 1, and a low-temperature polysilicon layer 2, a plurality of insulating layers 3 and a gate 4 which are arranged on the substrate 1; wherein at least one insulating layer which is located on the side of the low temperature polysilicon layer 2 away from the substrate, are formed by organic material and has vias 5.

The thin-film transistors according to the embodiments of the present disclosure include a plurality of insulating layers 3, wherein at least one insulating layer arranged directly above the low temperature polysilicon layer 2 is formed by organic material, thus an exposing and developing process can be used to form vias in the organic material, which can effectively avoid the over-etching of the low temperature polysilicon layer 2 caused by dry etch process.

Figure 2:
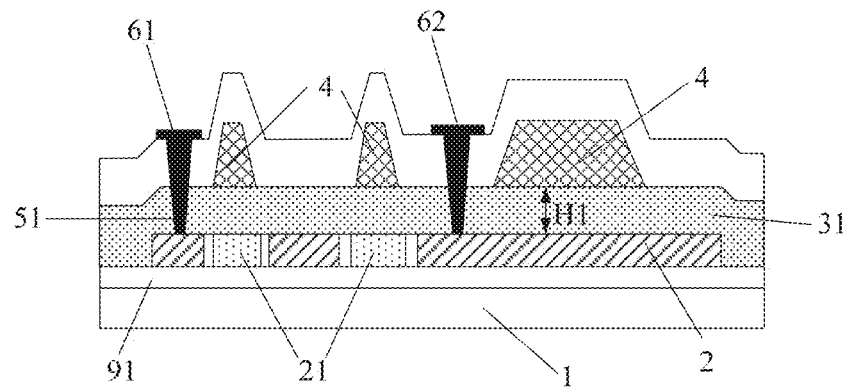
FIG. 2-7 is a schematic diagram of the thin-film transistor structure according to another embodiment of the present disclosure.
Figure 7:
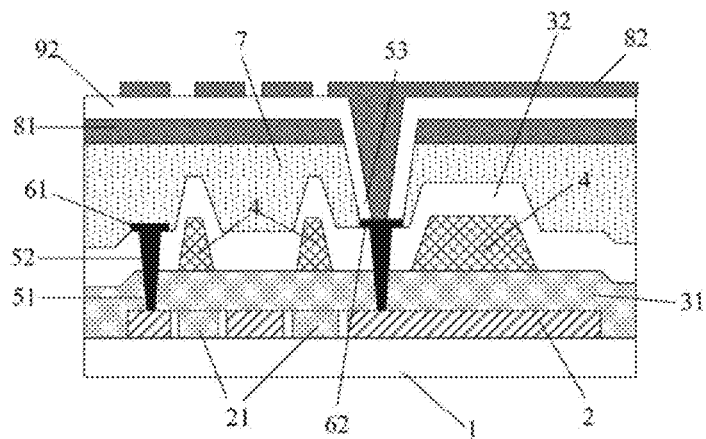
Figure 8:
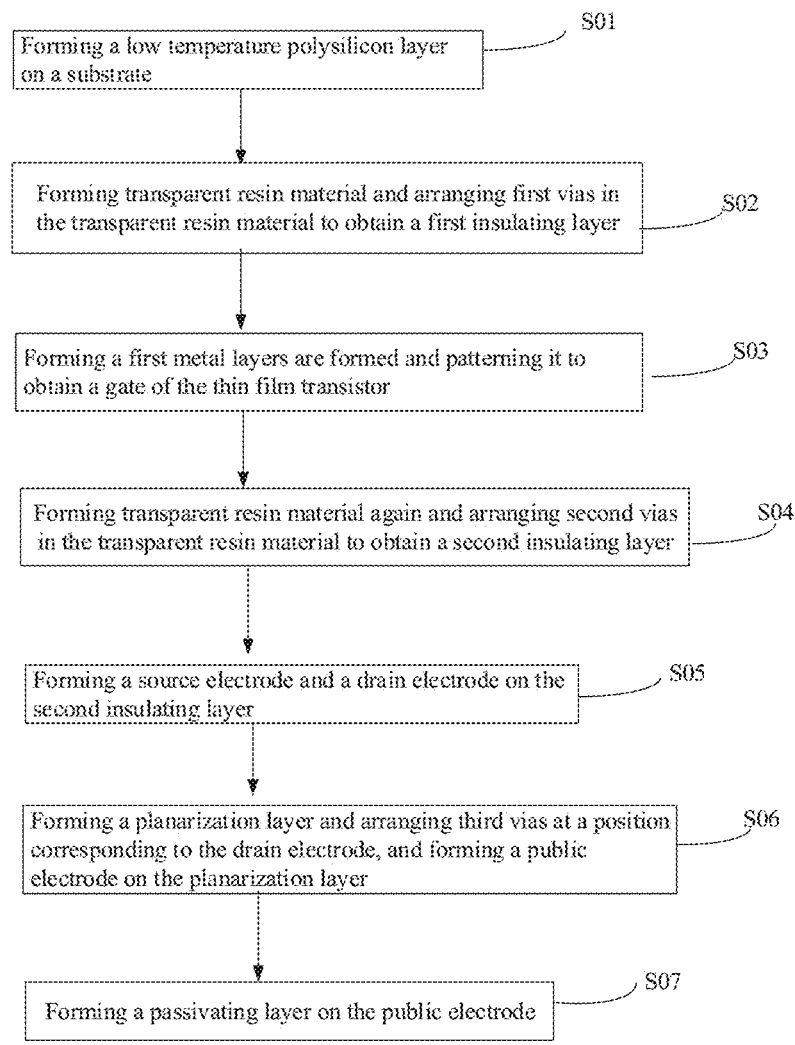
FIG. 8 is a flowchart of the method for manufacturing the thin-film transistors according to the present disclosure.

Some other embodiments of the present disclosure provide a thin-film transistor, as shown in FIGS. 2 and 7, comprising a substrate 1, a low-temperature polysilicon layer 2 above the substrates 1, a first insulating layer 31 formed by the organic material and a gate 4. Specifically, the first insulating layer 31 is located on the side of the low-temperature polysilicon layer 2 away from the substrates, and the gate 4 is located on the side of the first insulating layers 31 away from the substrates, wherein, the first insulating layers 31 have first vias 51.

The Substrate 1 can be made of transparent materials such as glass and the like. As an active layer, the low-temperature polysilicon layer 2 is doped with phosphorus or boron at some positions to form doping regions 21, so as to enhance its electronic properties. The gate 4 is made of at least one selected from molybdenum, molybdenum niobium, aluminum, aluminum neodymium alloy, titanium or copper. The first insulating layer 31 located on the side of the low temperature polysilicon layer 2 away from the substrates, also referred as an interlayer insulating layer, is formed by organic material. In this way, the first vias 51 can be formed in the organic material by an exposing and developing process, which can effectively avoid the over-etching problem of the low-temperature polysilicon layer 2 caused by dry etch process.

The organic material may be selected from transparent polymer material, such as polymethyl methacrylate (PMMA), polyethylene terephthalate (PET), polycarbonate (PC), polyurethane (PU) and polyimide (PI). Since the above organic material is transparent, so the light transmittance of the final product would not be influenced.

Particularly, since the above organic material is used as the insulating layers, the vias in the organic insulating layers could be formed by the exposure and developing process with mask plates, which not only avoids the over-etching problem of the polysilicon layer caused by the dry etch process, but also saves cost.

Specifically, the organic insulating layer has a thickness from 1.5 μm to 3.0 μm in the direction perpendicular to the substrate 1. In other words, as shown in FIG. 2, the first insulating layers 31 has a thickness H1 in the range from 1.5 μm to 3.0 μm.

The organic insulation layer having a thickness H1 larger than 1.5 μm could ensure the insulating properties between the gate 4 above the organic insulation layer and the low temperature polysilicon layer 2 below the organic insulation layer. The organic insulating layer having a thickness H1 not more than 3.0 μm could avoid increasing the thickness of the final products and there by being more suitable for ultra-thin displays.

In an embodiment of the present disclosure, as shown in FIG. 2, a buffer layer 91 is arranged between the substrate 1 and the low temperature polysilicon layer 2. The buffer layer 91 may be a single layer or a laminated layer with multiple sub-layers, and the buffer layer 91 may be formed by silicon oxide or silicon nitride.

In another embodiment of the present disclosure, the insulating layers also comprise a second insulating layer 32 which is arranged on the side of the gate 4 away from the substrate and has second vias 52.

In yet another embodiment of the present disclosure, the thin-film transistor also includes a source electrode 61 and a drain electrode 62 arranged above the second insulating layer 32, and the source electrode and the drain electrode are in contact with the low temperature polysilicon layer 2 through the first vias 51 and the second vias 52.

As shown in FIG. 7, the second insulating layer 32 is arranged on the gate 4, also known as an insulating layer of the gate 4. The second insulating layer 32 may also be formed with organic material, and the second vias 52 are formed in the second insulating layer 32 by an exposing and developing process, which could effectively avoid the over-etching of the low temperature polysilicon layer 2.

In addition, since the second vias 52 in the second insulating layer 32 are arranged at the positions corresponding to that of the first vias 51 in the first insulating layer 31, another advantage of the second insulating layer 32 formed by organic material is that the first vias 51 and the second vias 52 can be formed by one-step exposure technology, which can simplifies process and saves costs.

It is understood that the second insulating layer 32 may also be made of silicon nitride or silicon oxide instead of organic material. That is to say, only the first insulating layer 31 closed to the low temperature polysilicon layer 2 is formed by organic material, so as to avoid the over-etching of the low temperature polysilicon layer 2.

Optionally, the orthographic projections of the first vias on the substrate at least partially coincide with those of the second vias on the substrate.

In other words, in the direction perpendicular to the substrate, the second vias 52 in the insulating layer 32 is aligned to the first vias 51 in the insulating layer 31, so one-step exposure technology can be used to form the second vias 52 and the first vias 51 when the first insulating layer and the second insulating layer both are formed by organic material, which can simplify process and save costs.

In an embodiment of the present disclosure, the thin-film transistor includes a planarization layer 7 and a public electrode 81, wherein the planarization layer 7 is located on the side of the source electrode 61 and drain electrode 62 away from the substrates; third vias 53 are arranged in the planarization layer 7 at the positons corresponding to the drain electrode, and the public electrode 81 is arranged above the planarization layer 7 and contacts with the drain electrode 62 through the third vias 53.

FIG. 7 shows the planarization layer 7 on the side of the source electrode 61 and drain electrode 62 away from the substrate. The third vias 53 in the planarization layer 7 and the public electrode 81 are located at the positions corresponding to the position of the drain electrode 62. In addition, the passivating layer 92 and the pixel electrode 82 are also shown in FIG. 7, and the pixel electrode 82 is connected to the drain electrode 62 through the third vias and the vias in the passivating layer 92. The size and thickness of the structures only are schematically shown in the drawings. In fact, the projected area of each layer on the substrate 1 may be the same or different, and the desired projected area of each layer can be achieved by an etching process. Similarly, the structure shown in the drawings do not limit the geometric shapes of each layer, such as the rectangle and trapezoid shown in the drawings or other shapes.

Figure 3:
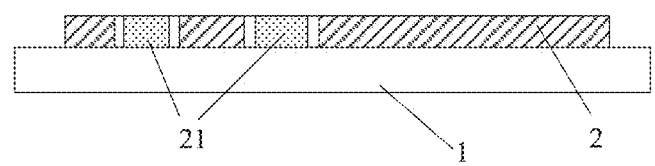

Some embodiments of the present disclosure also provide a method for manufacturing a thin-film transistor, comprising the following steps:

S01, as shown in FIG. 3, amorphous silicon a-Si is deposited on a substrate made of transparent material such as glass, and then the amorphous silicon is crystallized to form polysilicon p-Si by "low temperature" crystallization process which makes a-Si in a depth of at least 50 Angstrom from the surface converting to p-Si.

Two common crystallization methods are excimer laser crystallization and metal induced crystallization. However, the method of the present disclosure for converting amorphous silicon into polysilicon is not limited to the above two methods, as long as the polysilicon transformation of the active layer can be achieved.

Optionally, before the deposition of amorphous silicon, silicon oxide or silicon nitride is used to form the buffer layer 91 on the substrate 1, as shown in FIG. 2. The substrate 1 is pre-cleaned prior to forming the buffer layer 91. The buffer layer 91 may be a single layer or a laminated layer with multiple sub-layers. Then, the low temperature polysilicon layer 2 is formed on the buffer layer 91.

Figure 4:
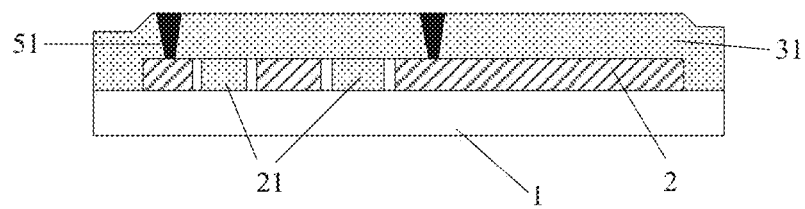

S02, as shown in FIG. 4, the first insulating layer 31 is formed by organic material on the polysilicon material layer 2, and first vias 51 are formed in the first insulating layer 31.

Specifically, S02 includes the following steps:

S02a. The first organic film is formed by coating organic material on the polysilicon material layer. The organic material may be a transparent resin, such as anyone or any combination of polymethyl methacrylate (PMMA), polyethylene terephthalate (PET), polycarbonate (PC), polyurethane (PU), and polyimide (PI). It should be noted that the coated organic material may be multilayer or monolayer or the coated organic material may be prepolymer of the above-mentioned polymers or a mixture solution of monomers of these polymers. Herein, PMMA prepolymer is used as an example in the detailed description for the subsequent steps, and other transparent resins are similar with PMMA.

S02b, the first organic film (PMMA film) is cured at vacuum degree of 20 to 100 Pa, heating temperature of 80 to 130° C. for 90 s to 140 s;

S02c, the first organic film obtained in S02b is exposed and developed with a mask at exposure energy of 150 to 300 MJ to form the first vias 51.

S02d, the first organic film obtained in S02c is further cured at atmospheric pressure and heating temperature of 200° C. to 250° C. for 40 min to 120 min to get the first insulating layer 31. The first insulating layer has a thickness of 1.5 μm to 3.0 μm.

Figure 5:
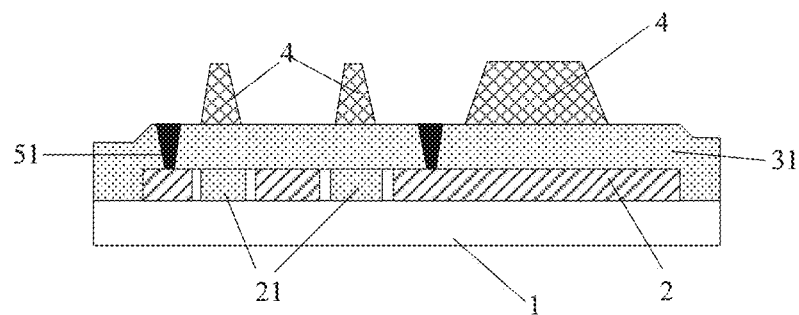

S03, as shown in FIG. 5, a first metal layer is formed and patterned to obtain the gate 4 of the thin-film transistor. Material for the Gate includes but not limited to one or more of Al, Mo, Cu, Ag, Cr, Ti, AlNi, MoTi and the like. The gate has a thickness of 1500 to 6000 angstrom.

Figure 6:
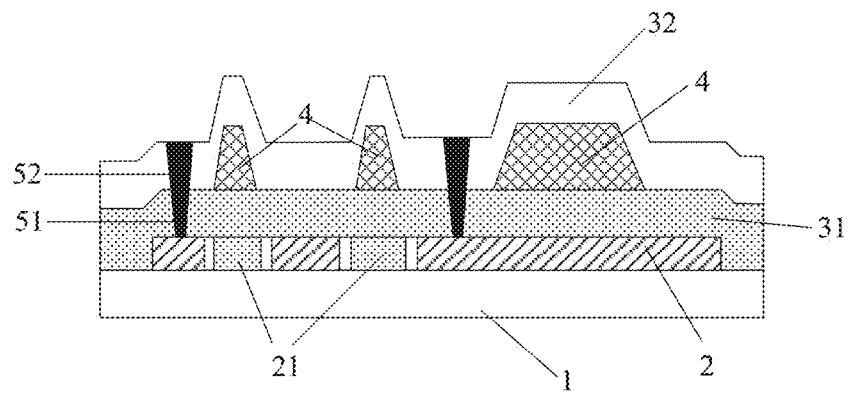

S04, as shown in FIG. 6, a second insulating layer 32 made of the organic material with second vias 52 are formed on the gate 4.

The second insulating layer is formed similarly according to the specific steps of S02. It should be noted that the second vias 52 in the second insulating layer 32 is formed at the positions corresponding to those of the first vias 51 in the first insulating layer 31. Thus, the exposing and developing process for S02 and S04 can be completed in one step, which simplifies the technological processes and saves costs. In this case, only specific steps S02a and S02b are performed in step S02 to obtain the cured first organic film.

As mentioned above, the second insulating layer 32 can also be made of silicon nitride or silicon oxide. In this case, only specific steps S02a and S02b are performed in the S02 step to obtain the cured first organic film layers; step S03 is performed subsequently to form the gate on the cured first organic film; and then the silicon nitride or silicon oxide is deposited to form the second insulating layer.

The vias in the second insulating layer formed by silicon nitride or silicon oxide are formed by a mask and etching process, and then the vias in the first insulating layer 31 are formed by an exposing and developing process.

In addition to the above steps, the following steps usually are included during the manufacturing of the thin-film transistor:

S05, a source electrode 61 and a drain electrode 62 are formed on the second insulating layer 32. Specifically, the source electrode 61 and drain electrode 62 can be made of at least one of molybdenum, molybdenum niobium alloy, aluminum, aluminum neodymium alloy, titanium or copper. More specifically, the source and drain electrodes can be formed as metal films by puttering, thermal evaporation, plasma enhanced chemical vapor deposition (PECVD), low pressure chemical vapor deposition (LPCVD) and atmospheric pressure chemical vapor deposition (APCVD) or electron cyclotron resonance chemical vapor deposition (ECR-CVD). Then, a pattern including the source electrode 61 and drain electrode 62 is formed simultaneously by patterning process (film formation, exposure, development, wet etch or dry etch) with half tone mask (HTM) or gray tone mask (GTM).

S06, a planarization layer 7 and a public electrode 81 are formed on the source electrode 61 and drain electrode 62, and the third vias 53 are formed in the planarization layer 7 and the public electrode 81 at the positions corresponding to the position of the drain electrode 62. The planarization layer 7 is mainly used to make the upper surface of the product planar, so as to deposit the electrode on the planar surface.

S07, a passivating layer 92 is formed on the pubic electrode 81, and vias are formed in the passivating layer 92. The passivating layer 92 may be a single layer or a laminated layer with multiple sub-layers, which may be formed by silicon oxide, silicon nitride, hafnium oxide or aluminum oxide.

S08, a pixel electrode 82 is formed on the passivating layer 92, and the pixel electrode 82 is connected with the drain electrode 62 through the vias in the passivating layers 92 and the third vias 53.

The insulating layers in the method according to this embodiment are made of organic material, the vias in the insulating layers do not need to be formed by a dry etch process, but just adopt an exposing and developing process. Therefore, it can effectively avoid the over-etching problem of the low temperature polysilicon layer below the insulating layers, and it can also increase the contact area and uniformity of the drain electrode and the low temperature polysilicon layer, thereby improving the electrical conductivity.

In addition, the exposing and developing process of the second vias in the second insulating layer and the first vias in the first insulating layer can be completed in one step, which can greatly reduce the production cycle and improve the productivity of the equipment.

Some embodiments of the present disclosure provide an array substrate comprising a plurality of the mentioned thin-film transistors arranged in an array.

Some embodiments of the present disclosure provide a display apparatus comprising the mentioned array substrate. The display apparatus may be liquid crystal display panel, electronic paper, mobile phone, tablet computer, television, display, laptop, digital photo frame, navigation device and any other products or components with display functions.

Obviously, there can be many variations and improvements in the specific implementation conditions of the above embodiments, for example the specific parameters of each process step can be adjusted according to the require, and the specific steps of different products can be changed according to the actual situation.

It is understood that the above embodiments are only exemplary ones used to illustrate the principles of the present disclosure, but the present disclosure is not limited to these. For ordinary technical personnel in this field, various variations and improvements can be made without breaking away from the spirit and essence of the present disclosure, and these variations and improvements are also regarded as the scope of protection of the present disclosure.

The invention claimed is:

1. A method for manufacturing a thin-film transistor comprising the following steps:
    forming a low temperature polysilicon layer on a substrate;
    forming an organic insulating layer on the side of the low temperature polysilicon layer away from the substrates, and forming vias in the organic insulating layer;
    forming a first metal layer and patterning it to obtain a gate of the thin-film transistor,
    wherein forming the organic insulating layer with vias comprises the following steps:
    coating an organic material on the low temperature polysilicon layer to form a film;
    performing a first curing of the obtained film;
    exposing and developing the film after the first curing to form the vias;
    performing a second curing of the film with the vias to form the organic insulating layer,
    wherein the first curing is carried out at vacuum degree of 20 Pa to 100 Pa and heating temperature of 80° C. to 130° C. for 90 s to 140 s and the second curing is carried out at atmospheric pressure and heating temperature of 200° C. to 250° C. for 40 min to 120 min,
    wherein the organic insulating layer has a thickness of 1.5 μm to 3.0 μm in the direction perpendicular to the substrate.

* * * * *